(12) United States Patent
Moon et al.

(10) Patent No.: US 9,705,085 B2
(45) Date of Patent: Jul. 11, 2017

(54) METHOD FOR MANUFACTURING ORGANIC LIGHT-EMITTING DEVICE

(71) Applicant: LG DISPLAY CO., LTD., Seoul (KR)

(72) Inventors: Young Kyun Moon, Daejeon (KR); Minsoo Kang, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/910,209

(22) PCT Filed: Sep. 30, 2014

(86) PCT No.: PCT/KR2014/009239
§ 371 (c)(1),
(2) Date: Feb. 4, 2016

(87) PCT Pub. No.: WO2015/047054
PCT Pub. Date: Apr. 2, 2015

(65) Prior Publication Data
US 2016/0190455 A1    Jun. 30, 2016

(30) Foreign Application Priority Data

Sep. 30, 2013    (KR) .................... 10-2013-0116195

(51) Int. Cl.
*H01L 51/00*    (2006.01)
*H01L 51/56*    (2006.01)
(Continued)

(52) U.S. Cl.
CPC ...... *H01L 51/0017* (2013.01); *H01L 27/3246* (2013.01); *H01L 51/0021* (2013.01);
(Continued)

(58) Field of Classification Search
CPC ......... H01L 33/00; H01L 51/40; H01L 51/52; H01L 51/00; H01L 51/0017;
(Continued)

(56) References Cited

U.S. PATENT DOCUMENTS 6,046,542 A    4/2000  Silva et al.
2005/0212415 A1  9/2005  Jung et al.
(Continued)

FOREIGN PATENT DOCUMENTS

CN    101090149 A    12/2007
CN    101097379 A    1/2008
(Continued)

*Primary Examiner* — Chuong A Luu
(74) *Attorney, Agent, or Firm* — Dentons US LLP

(57) ABSTRACT

The present application relates to a method of preparing an organic light emitting device. The method of preparing the organic light emitting device according to the present application includes: 1) forming a first electrode on a substrate; 2) forming an auxiliary electrode on at least a partial region on the first electrode; 3) forming an insulating layer on the auxiliary electrode, and forming an overhang structure, in which the insulating layer has a greater width than that of the auxiliary electrode; and 4) forming a second electrode on the first electrode and the insulating layer, so that the second electrode provided on the first electrode and the second electrode provided on the insulating layer are electrically short-circuited to each other.

14 Claims, 2 Drawing Sheets

(51) Int. Cl.
*H01L 51/52* (2006.01)
*H01L 27/32* (2006.01)

(52) U.S. Cl.
CPC ...... *H01L 51/0032* (2013.01); *H01L 51/5203* (2013.01); *H01L 51/5212* (2013.01); *H01L 51/5225* (2013.01); *H01L 51/56* (2013.01)

(58) Field of Classification Search
CPC . H01L 51/0021; H01L 51/56; H01L 51/5212; H01L 51/524; H01L 51/0023; H01L 27/32; H01L 27/3211; H01L 27/3246; H01L 27/6248; H01L 27/3276
USPC ............................................. 438/39, 82, 99
See application file for complete search history.

(56) References Cited

U.S. PATENT DOCUMENTS

| | | |
|---|---|---|
| 2006/0055313 A1 | 3/2006 | Bae et al. |
| 2007/0087468 A1 | 4/2007 | Doll et al. |
| 2007/0236142 A1* | 10/2007 | You ..................... H01L 27/3283 313/506 |
| 2007/0284595 A1* | 12/2007 | Choi ................... H01L 27/3246 257/88 |
| 2008/0001524 A1* | 1/2008 | Lee ..................... H01L 27/3246 313/498 |
| 2009/0321764 A1 | 12/2009 | Lee et al. |
| 2013/0001564 A1* | 1/2013 | Choi ................... H01L 27/3276 257/59 |
| 2013/0049578 A1 | 2/2013 | Burroughes et al. |

FOREIGN PATENT DOCUMENTS

| | | |
|---|---|---|
| EP | 0767599 A2 | 4/1997 |
| JP | 2004327680 A | 11/2004 |
| JP | 2009-004347 A | 1/2009 |
| JP | 2009-545117 A | 12/2009 |
| JP | 2012-195288 A | 10/2012 |
| KR | 10-2007-0118425 A | 12/2007 |
| TW | I285516 B | 8/2007 |

\* cited by examiner

METHOD FOR MANUFACTURING ORGANIC LIGHT-EMITTING DEVICE

TECHNICAL FIELD

This application is a National Phase Entry of PCT/KR2014/009239 filed on Sep. 30, 2014 and claims priority to Korean Application No. 10-2013-0116195 filed in the Korean Intellectual Property Office on Sep. 30, 2013, both of which are incorporated by reference for all purposes as if fully set forth herein.

The present application relates to a method of preparing an organic light emitting device.

BACKGROUND ART

An organic light emitting device is composed of two opposing electrodes and organic material thin films including a plurality of layers having a semiconductor-like property interposed therebetween. The organic light emitting device having the configuration uses a phenomenon in which electric energy is converted into light energy by using an organic material, that is, an organic light emitting phenomenon. Particularly, when a voltage is applied between two electrodes in a structure in which an organic material layer is disposed between an anode and a cathode, holes from the anode and electrons from the cathode are injected into the organic material layer. When the injected holes and electrons meet each other, an exciton is formed, and the exciton falls down to a bottom state to emit light.

In the aforementioned organic light emitting device, light generated from the organic material layer is emitted through a light transmissive electrode, and the organic light emitting device may be typically classified into a top emission type, a bottom emission type and a dual emission type. For the top emission or bottom emission type, one of two electrodes needs to be a light transmissive electrode, and for the dual emission type, both of the two electrodes need to be light transmissive electrodes.

In respect to the aforementioned organic light emitting device, many studies have been concentrated since Kodak Co., Ltd., announced that when a multilayer structure is used, the device may be driven at a low voltage, and recently, a natural color display using the organic light emitting device is attached to a mobile phone and commercialized.

Further, as recent studies on the organic light emitting device using a phosphorescent material instead of an existing fluorescent material have been conducted, efficiency has been rapidly improved, and it is also expected that the device may be replaced with the existing lighting in the near future.

In order to use the organic light emitting device as lighting, the device needs to be driven at high brightness unlike the existing natural color display, and to maintain a constant brightness similar to the existing lighting. In order to sufficiently improve the brightness of the organic light emitting device, light needs to be emitted in a large area, and in order to implement light emission in the large area, a high driving current needs to be used. In addition, in order to maintain the constant brightness in the large area, the aforementioned high current needs to be uniformly injected into the device having a large area.

DETAILED DESCRIPTION OF THE INVENTION

Technical Problem

In the technical field, there is demanded a research on an organic light emitting device which can be prepared by a simpler process.

Technical Solution

An exemplary embodiment of the present application provides a method of preparing an organic light emitting device, including: 1) forming a first electrode on a substrate; 2) forming an auxiliary electrode on at least a partial region on the first electrode; 3) forming an insulating layer on the auxiliary electrode, and forming an overhang structure, in which the insulating layer has a greater width than that of the auxiliary electrode; and 4) forming a second electrode on the first electrode and the insulating layer, so that the second electrode provided on the first electrode and the second electrode provided on the insulating layer are electrically short-circuited to each other.

Advantageous Effects

In the organic light emitting device according to the exemplary embodiment of the present application, it is possible to exclude the use of a mask for forming a pattern used in the related art during the manufacturing process of the second electrode by forming the first electrode and the second electrode which is electrically short-circuited on the overhang structure. Accordingly, it is possible to reduce process costs for preparing the organic light emitting device.

EXPLANATION OF REFERENCE NUMERALS AND SYMBOLS

Figure 1:
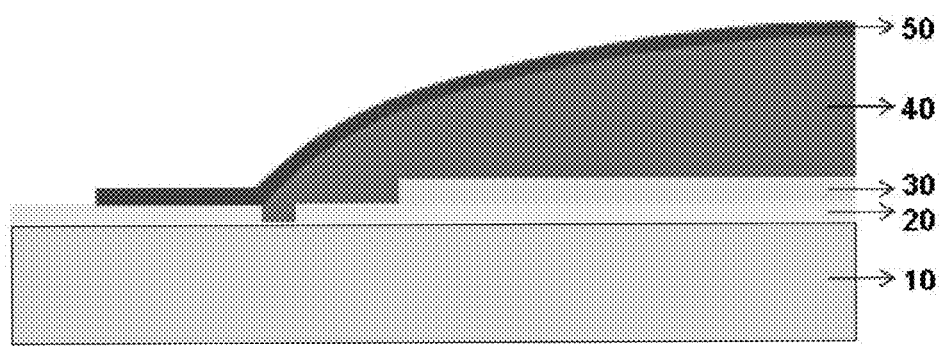
FIGS. 1 and 2 are diagrams illustrating an electrode for an organic light emitting device in the related art.

10: Substrate
20: Anode
30: Auxiliary electrode
40: Insulating layer
50: Cathode

BEST MODE

Hereinafter, the present application will be described in detail.

In general, an organic light emitting device for lighting has a structure in which a transparent electrode, an organic material layer, and a metal electrode are sequentially deposited on a substrate. When the organic light emitting device is prepared, deposition patterns of the organic material layer and the metal electrode have different areas on a plan view, and thus different masks are used when the organic material layer and the metal electrode are deposited. Accordingly, there are problems in that it is necessary to replace the mask during the deposition process, productivity is not high due to complex deposition equipment, and preparing costs are also high.

Accordingly, the present inventors had studied a conductive pattern, which can be prepared by a simpler process and is applicable to an electrode of an organic light emitting device, thereby completing the present invention.

A method of preparing an organic light emitting device according to an exemplary embodiment of the present application includes: 1) forming a first electrode on a substrate; 2) forming an auxiliary electrode on at least a partial region on the first electrode; 3) forming an insulating layer on the auxiliary electrode, and forming an overhang structure in which the insulating layer has a greater width than that of the auxiliary electrode; and 4) forming a second electrode on the first electrode and the insulating layer, so that the second electrode provided on the first electrode and the second electrode provided on the insulating layer are electrically short-circuited to each other.

In the present application, the second electrode and the auxiliary electrode provided on the first electrode may have a structure with an electrically short-circuited form, and the second electrode and the insulating layer provided on the first electrode may have a structure with an electrically short-circuited form.

That is, the auxiliary electrode may be provided on a part, not an entire surface, on the first electrode.

In the present application, the structure with the electrically short-circuited form means a form in which the second electrode and the auxiliary electrode or the insulating layer are physically separated and are structurally disposed to be spaced apart from each other.

In the related art, a mask for forming a pattern was used in order to form the second electrode, that is, the pattern of the second electrode, including the electrical short-circuit structure. However, in the present application, it is possible to prepare the organic light emitting device including an electrode structure in which the second electrode, which is formed on the first electrode, and the second electrode, which is formed on the dual layer having the overhang structure, are electrically short-circuited without a separate mask for forming a pattern, by forming the first electrode, and the second electrode on a dual layer having the overhang structure formed on the first electrode.

In the present application, the overhang structure of 3) may be formed by separately or simultaneously etching the auxiliary electrode and the insulating layer.

In the present application, the auxiliary electrode and the insulating layer include materials which have different etching speeds by the same etchant so that the insulating layer having the overhang structure, which has a greater width than that of the auxiliary electrode, may be formed. That is, the insulating layer may include a material of which an etching speed by the same etchant is lower than that of the auxiliary electrode.

Further, the insulating layer having the overhang structure may also be formed by differentiating the kind of etchant used for forming the auxiliary electrode and the insulating layer.

Particular examples of the etchant include hydrofluoric acid (HF), phosphoric acid ($H_3PO_4$), a buffered oxide etchant (BOE), a buffered HF solution (BHF), a hydrogen peroxide-based etchant, $CH_3COOH$, HCl, $HNO_3$, and a ferric-based etchant, but are not limited thereto.

Figure 6:
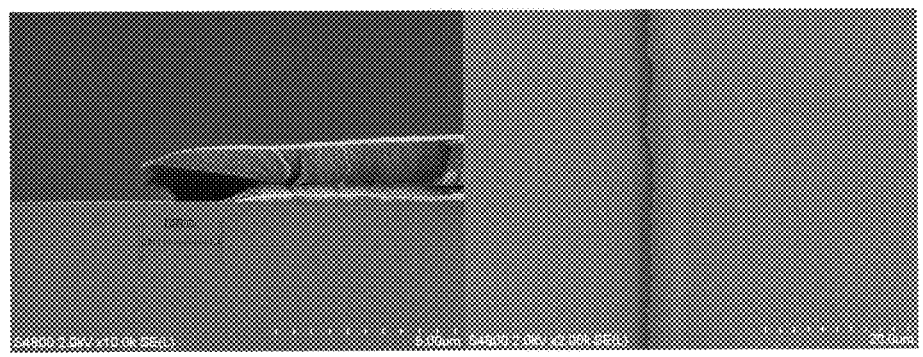
FIG. 6 is a view showing an electronic picture of an overhang structure according to the exemplary embodiment of the present application.

Particularly, it is possible to form an optimized overhang structure by appropriately adjusting an etching time, a temperature, and the like during the etching process of the auxiliary electrode and the insulating layer. A picture of the overhang structure according to the exemplary embodiment of the present application is shown in FIG. 6.

In the present application, the auxiliary electrode is for the purpose of improving resistance of the first electrode, and may be formed by depositing or printing one or more selected from the group consisting of a conductive sealant and a metal. More particularly, the auxiliary electrode may include one or more of magnesium, calcium, sodium, potassium, titanium, indium, yttrium, lithium, gadolinium, aluminum, silver, tin, lead, chrome, molybdenum, copper, and an alloy thereof, but is not limited thereto. A thickness of the auxiliary electrode may be from 50 nm to 5 μm, but is not limited thereto.

The insulating layer may be formed by using a material and a method known in the art. More specifically, the insulating layer may be formed by using a general photoresist material; polyimide; polyacryl; silicon nitride; silicon oxide; aluminum oxide; aluminum nitride; an alkali metal oxide; an alkaline earth metal oxide, and the like, but the material thereof is not limited thereto. A thickness of the insulating layer may be from 10 nm to 10 μm, but is not limited thereto.

In the present application, a substrate known in the art may be used as the substrate without limitation, and more specific examples of the substrate include a glass substrate, a plastic substrate and the like, but are not limited thereto.

In the present application, the first electrode may include a transparent conductive oxide. The transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al), and lanthanum (La).

Furthermore, the first electrode may include one or more of magnesium, calcium, sodium, potassium, titanium, indium, yttrium, lithium, gadolinium, aluminum, silver, platinum, gold, tungsten, tantalum, copper, tin, lead, and an alloy thereof.

The first electrode may be formed by using any one physical vapor deposition (PVD) selected from sputtering, E-beam evaporation, thermal evaporation, laser molecular beam epitaxy (L-MBE), and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD), and hydride vapor phase epitaxy (HVPE); or atomic layer deposition (ALD).

In the present application, the second electrode may include a transparent conductive oxide. The transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Jr), rhodium (Rh), ruthenium (Ru), tungsten (W), cobalt (Co), nickel (Ni), manganese (Mn), aluminum (Al), and lanthanum (La).

Furthermore, the second electrode may include one or more of magnesium, calcium, sodium, potassium, titanium, indium, yttrium, lithium, gadolinium, aluminum, silver, platinum, gold, tungsten, tantalum, copper, tin, lead, and an alloy thereof.

The second electrode may be formed by using any one physical vapor deposition (PVD) selected from sputtering, E-beam evaporation, thermal evaporation, laser molecular beam epitaxy (L-MBE), and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD), and hydride vapor phase epitaxy (HVPE); or atomic layer deposition (ALD).

A thickness of the second cathode may be from 50 nm to 5 μm, but is not limited thereto.

In the present application, on the first electrode, a region, on which the auxiliary electrode is provided, is a non-emission region, and a region, on which the auxiliary electrode is not provided, is an emission region. In this case, an organic material layer may be additionally provided on the first electrode within the emission region. That is, the first electrode, the organic material layer, and the second electrode may be sequentially provided on the emission region.

Specific materials and formation methods for the organic material layer are not particularly limited, and materials and formation methods widely known in the art may be used.

The organic material layer may be manufactured with fewer layers by using various polymer materials by a deposition method, or a solvent process, for example, a method, such as spin coating, dip coating, doctor blading, screen printing, inkjet printing, or thermal transfer.

The organic material layer may include an emission layer, and have a laminate structure that includes one or more selected from a hole injection layer, a hole transport layer, an electron transport layer, and an electron injection layer.

As a material capable of forming the hole injection layer, in general, a material having a large work function is preferred such that hoes are easily injected into the organic material layer. Particular examples of the hole injection material usable in the present application include: a metal, such as vanadium, chrome, copper, zinc, and gold, or an alloy thereof; metal oxides, such as zinc oxides, indium oxides, indium tin oxides (ITO), and indium zinc oxides (IZO); a combination of a metal and an oxide, such as $ZnO:Al$ or $SnO_2:Sb$; and conductive polymers, such as poly(3-methylthiophene), poly[3,4-(ethylene-1,2-dioxy) thiophene] (PEDT), polypyrrole, and polyaniline, but are not limited thereto.

As a material capable of forming the electron injection layer, in general, a material having a small work function is preferred such that electrons are easily injected into the organic material layer. Particular examples of the electron injection material include: a metal, such as magnesium, calcium, sodium, potassium, titanium, indium, yttrium, lithium, gadolinium, aluminum, silver, tin, and lead or an alloy thereof; a multilayered structure material, such as LiF/Al or $LiO_2$/Al, and the like, and the same material as the hole injection electrode material may be used, but the examples of the electron injection material are not limited thereto.

As a material capable of forming the emission layer, a material, which is capable of emitting light in a visible ray region by receiving holes from the hole transport layer and electrons from the electron transport layer, and combining the holes and the electrons, and has high quantum efficiency for fluorescence or phosphorescence, is preferred. Particular examples thereof include an 8-hydroxy-quinoline-aluminum complex ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene)(PPV)-based polymers; spiro compounds; polyfluorene and rubrene; phosphorescence host CBP[[4,4'-bis(9-carbazolyl)biphenyl]; and the like, but are not limited thereto.

Further, the light emitting material may additionally include a phosphorescent dopant or a fluorescent dopant in order to improve fluorescent or phosphorescent characteristics. Particular examples of the phosphorescent dopant include ir(ppy)(3) [fac tris(2-phenylpyridine) iridium], F2Irpic [iridium(III)bis(4,6,-di-fluorophenyl-pyridinato-N, C2) picolinate], or the like. As the fluorescent dopant, those known in the art may be used.

As a material capable of forming the electron transport layer, a material which is capable of receiving electrons from the electron injection layer well and transport the electrons to the emission layer and has high mobility to electrons, is suitable. Particular examples thereof include: an 8-hydroxy-quinoline Al complex; a complex including $Alq_3$; an organic radical compound; a hydroxyflavone-metal complex and the like, but are not limited thereto.

The organic light emitting device prepared according to the exemplary embodiment of the present application may be more preferably applied to an organic light emitting device for lighting, but is not limited thereto.

Figure 2:
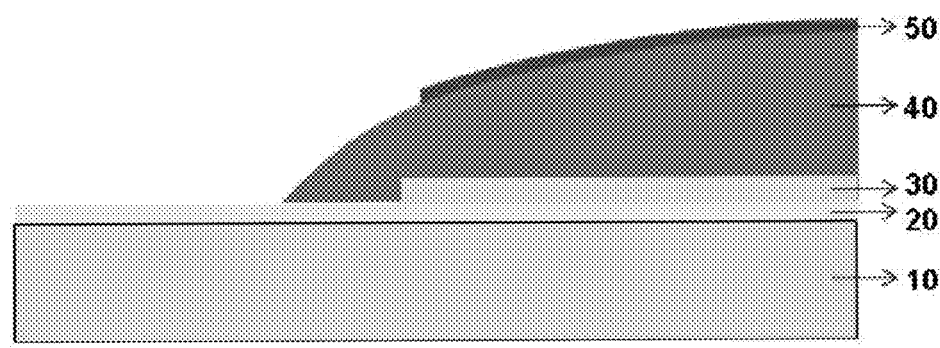
Figure 3:
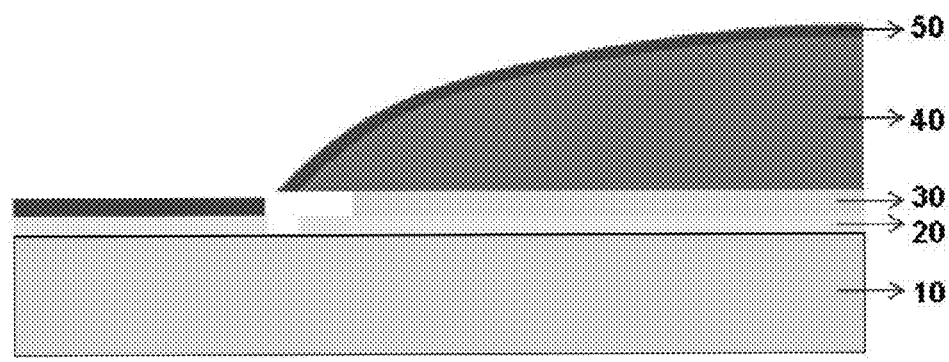
FIGS. 3 to 5 are diagrams illustrating an electrode for an organic light emitting device according to an exemplary embodiment of the present application.
Figure 4:
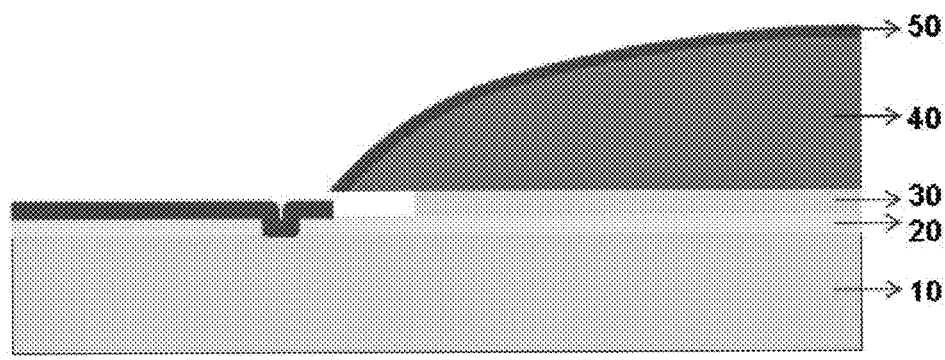
Figure 5:
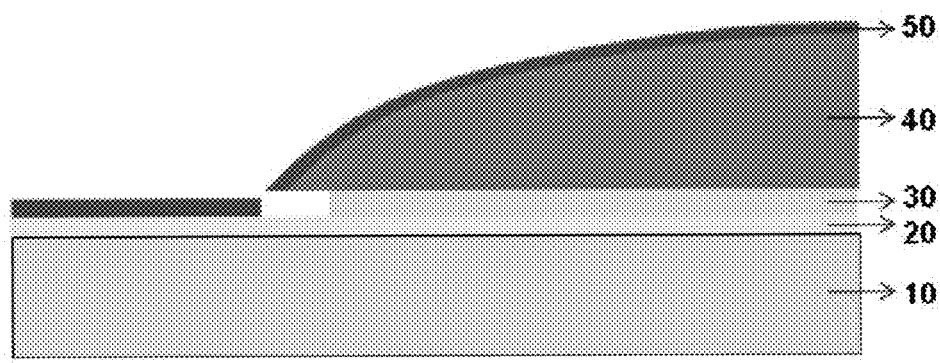

The electrode for the organic light emitting device in the related art is illustrated in FIGS. 1 and 2, and the electrode for the organic light emitting device according to the exemplary embodiment of the present application is illustrated in FIGS. 3 to 5.

Referring to the result of FIGS. 3 to 5, the organic light emitting device according to the exemplary embodiment of the present application includes: a substrate 10; an anode 20 provided on the substrate 10; an auxiliary electrode 30 provided on the anode 20; an insulating layer 40 provided on the auxiliary electrode 30, and having an overhang structure having a greater width than that of the auxiliary electrode 30; and a cathode 50 provided on the anode 20 and the insulating layer 40, and has an electrode structure in which the cathode 50 provided on the anode 20 and the cathode 50 provided on the insulating layer 40 are electrically short-circuited to each other.

In a deposition process accompanied during the preparation of the organic light emitting device, a mask made of a metal material is used as a shadow mask. More particularly, one or more shadow masks are used during an organic material deposition process, and one shadow mask is used during a deposition process of the second electrode.

However, when a laminated body according to the exemplary embodiment of the present application is manufactured, the metal shadow mask is not necessary, so that it is possible to reduce manufacturing cost of the mask, and maintenance cost according to periodical cleaning and replacement of the mask. Further, it is possible to configure a deposition process using no mask by grafting an organic material patterning technique, and the like. Further, when the mask is removable from deposition equipment, it is possible to simplify a conveying part of the equipment. Particularly, as the equipment, the glass, and the like become large, an effect of reducing cost according to the aforementioned simplification may be considerably increased.

As described above, in the organic light emitting device according to the exemplary embodiment of the present application, it is possible to exclude the use of a mask for forming a pattern used in the related art during the manufacturing process of the second electrode, by forming the first electrode and the second electrode which is electrically short-circuited on the overhang structure. Accordingly, it is possible to reduce process costs for preparing the organic light emitting device.

The invention claimed is:

1. A method of preparing an organic light emitting device, comprising:
    a) forming a first electrode on a substrate;
    b) forming an auxiliary electrode on at least a partial region on the first electrode;
    c) forming an insulating layer directly on the auxiliary electrode, and forming an overhang structure of the insulating layer and the auxiliary electrode, in which the insulating layer has a greater width than that of the auxiliary electrode and is spaced apart from the first electrode; and
    d) forming a second electrode on the first electrode and the insulating layer of the overhang structure, so that the second electrode provided on the first electrode on which the overhang structure is not formed and the second electrode provided on the insulating layer of the overhang structure are electrically short-circuited to each other.

2. The method of claim 1, wherein the second electrode and the auxiliary electrode provided on the first electrode have a structure with an electrically short-circuited form.

3. The method of claim 1, wherein the second electrode provided on the first electrode and the insulating electrode have a structure with an electrically short-circuited form.

4. The method of claim 1, wherein the overhang structure of c) is formed by separately or simultaneously etching the auxiliary electrode and the insulating layer.

5. The method of claim 4, wherein the auxiliary electrode and the insulating layer include materials of which etching speeds by the same etchant are different from each other.

6. The method of claim 4, wherein kinds of etchant used for forming the auxiliary electrode and the insulating layer are different from each other.

7. The method of claim 5, wherein the etchant comprises one or more selected from the group consisting of hydrofluoric acid (HF), phosphoric acid ($H_3PO_4$), a buffered oxide etchant (BOE), a buffered HF solution (BHF), a hydrogen peroxide-based etchant, $CH_3COOH$, HCl, $HNO_3$, and a ferric-based etchant.

8. The method of claim 1, wherein the auxiliary electrode comprises one or more selected from the group consisting of magnesium, calcium, sodium, potassium, titanium, indium, yttrium, lithium, gadolinium, aluminum, silver, tin, lead, chrome, molybdenum, copper, and an alloy thereof.

9. The method of claim 1, wherein the insulating layer comprises one or more selected from the group consisting of a photoresist material; polyimide; polyacryl; silicon nitride; silicon oxide; aluminum oxide; aluminum nitride; an alkali metal oxide; an alkaline earth metal oxide.

10. The method of claim 1, wherein the first electrode or the second electrode comprises at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Jr), rhodium (Rh), ruthenium (Ru), tungsten (W), cobalt (Co), nickel (Ni), manganese (Mn), aluminum (Al), and lanthanum (La).

11. The method of claim 1, wherein the first electrode or the second electrode comprises one or more selected from the group consisting of magnesium, calcium, sodium, potassium, titanium, indium, yttrium, lithium, gadolinium, aluminum, silver, platinum, gold, tungsten, tantalum, copper, tin, lead, and an alloy thereof.

12. The method of claim 1, wherein, on the first electrode, a region, on which the auxiliary electrode is provided, is a non-emission region, and a region, on which the auxiliary electrode is not provided, is an emission region.

13. The method of claim 12, further comprising: forming an organic material layer on the first electrode within the emission region.

14. The method of claim 1, wherein the organic light emitting device is intended for lighting.

* * * * *